US006691290B1

(12) United States Patent
Wu

(10) Patent No.: US 6,691,290 B1
(45) Date of Patent: Feb. 10, 2004

(54) DIAGNOSTIC ALGORITHM OF SECOND ORDER METAL RULE FOR STANDARD LIBRARY BELOW 0.13 μM

(75) Inventor: Jeremy Wu, Yunghe (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 125 days.

(21) Appl. No.: 10/139,022

(22) Filed: May 2, 2002

(51) Int. Cl.[7] .............................................. G06F 17/50
(52) U.S. Cl. ............................................. 716/4; 716/13
(58) Field of Search .............................. 716/1, 2, 7, 8, 716/9, 10, 11, 12, 13, 14, 15, 16, 4, 5

(56) References Cited

U.S. PATENT DOCUMENTS

| | | | |
|---|---|---|---|
| 5,483,461 A | | 1/1996 | Lee et al. .................... 364/490 |
| 5,721,959 A | * | 2/1998 | Nakamura et al. ............. 716/11 |
| 5,831,870 A | * | 11/1998 | Folta et al. ..................... 716/5 |
| 5,856,927 A | | 1/1999 | Greidinger et al. .......... 364/491 |
| 6,075,934 A | * | 6/2000 | Chiluvuri et al. ............. 716/10 |
| 6,298,469 B1 | | 10/2001 | Yin ................................ 716/3 |
| 6,308,309 B1 | | 10/2001 | Gan et al. ....................... 716/8 |

* cited by examiner

Primary Examiner—Leigh M. Garbowski
(74) Attorney, Agent, or Firm—George O. Saile; Stephen B. Ackerman

(57) ABSTRACT

The invention creates a grid of horizontal and vertical lines across a plane, the plane is the plane in which metal-1 is to be created. This plane overlies an (underlying) layer of metal, such as metal of a basic cell component, to which interconnects must be established by the metal-1 pattern. By using the coordinates of the intersects of the horizontal and the vertical lines, these intersects can be assigned attributes that indicate whether a particular intersect should or should not be connected to the underlying layer of metal. Using these attributes of the intersects of the imaginary metal grid, an intersect that can be interconnected with the underlying layer of metal can now be extended beyond that intersect, making a maximum pattern available for interconnect to a pin type in the underlying layer of metal. After the pattern of metal-1 has been created in this manner over the complete surface of the underlying layer of metal (of for instance a cell), the created metal-1 pattern can be analyzed for potential rule violations.

66 Claims, 8 Drawing Sheets

DIAGNOSTIC ALGORITHM OF SECOND ORDER METAL RULE FOR STANDARD LIBRARY BELOW 0.13 µM

BACKGROUND OF THE INVENTION (1) Field of the Invention

The invention relates to the fabrication of integrated circuit devices, and more particularly, to a new method and algorithm for routing second order of metal.

(2) Description of the Prior Art

The creation of Integrated Circuits (IC) comprises the creation of millions of transistors that form a semiconductor chip. The inherent complexity of the design and the layout of a semiconductor chip can only be addressed with automated software and hardware design tools whereby the emphasis is on automated software support without which the design of a semiconductor chip would be prohibitively complex and expensive.

The process of creating a semiconductor chip must, even with the help of complex hardware and mostly software support functions, be further approached in a relatively organized manner. This manner of organization is conventionally implemented by using either gate arrays or standard cells as the basic units for circuit integration within the scope of creating a semiconductor chip.

Gate arrays lend themselves to the objective of creating complex semiconductor devices because gate arrays have a fixed number of identical sites whereby each site comprises a number of basic and simple circuit elements. Functional characteristics of a complex chip can on a first level be implemented by interconnecting logic circuits that provide relatively basic logic functions such as inverters, and, or and nand gates, transfer gates and the like. A gate array can then further be used to interconnect the first level functions on a second level of interconnect by specifying the interconnections between the first level created circuit functions. A netlist is thereby used, which provides the interconnections between circuit elements of the gate array. It can readily be accepted that, in view of the complexity and the extent of the design of a semiconductor chip, a design aid such as a netlist must be maintained under control of a software support function.

The second basic approach that has been highlighted above, that is the use of standard cells for the creation of complex semiconductor chips, is based on the use of a number of standard circuit functions referred to as cells. While the gate array is of relatively limited design, the cells that are used as standard cells for the design of a semiconductor chip can be extended in functional capability leading from relative simple cell designs such as a simple logic gate to cells of a block-level component whereby each cell can contain a relatively complex semiconductor function such as a Random Access Memory (RAM) cell, a Read Only Memory (ROM) cell and the like. Again the standard cells that are used for the design of a semiconductor chip are maintained by software support functions whereby typically an inventory of cells is maintained on a data base referred to as a cell library. From the cell library standard cells can be retrieved for use in chip design whereby it is common practice to use numbers of standard cells for functional interconnection, thereby creating relatively complex circuit functions.

The above highlighted basic components that are used to create a complex semiconductor chip must be conductively interconnected, using a place and route tool, in order to create a functional chip design. For these conductive interconnections, design rules are used, which assure that the interconnections are provided in an optimum manner from the point of view of chip functionality and chip reliability. The place and route tool typically addresses first level of metal interconnects and accesses a standard library in which are stored data relating to the standard components (gate arrays or standard cells) that are used for the creation of the functional semiconductor chip. Layout of the higher levels of metal, such as second, third level of metal, etc., are typically addressed by separate software support packages. Since the first level metal (metal-1) place and route tool forms the first level of conductive interconnect, it is to be expected that this first level pick and route support optimally lends itself to assuring that higher levels of conductive interconnect are provided in am optimum manner. Stating this in another manner it can be said that the interaction between the standard library and the first level of metal interconnect place and route tool can be provided such that the standard library is not negatively affected by the first level of metal interconnect place and route tool. The invention addresses this aspect of chip layout and design in specifically assuring that the standard library can be applied for 0.13 µm conductive interconnect technology.

U.S. Pat. No. 6,308,309 B1 (Gan et al.) shows place holding library elements for defining routing paths.

U.S. Pat. No. 5,856,9274 (Greidinger et al.) is a method for automatically routing circuits involving a router tool.

U.S. Pat. No. 5,483,461 (Lee et al.) is a routing algorithm method involving router tool/program.

U.S. Pat. No. 6,298,469 B1 (Yin) reveals a circuit design method using a place and route process.

SUMMARY OF THE INVENTION

A principle objective of the invention is to create a new rule for routing a layer of interconnect metal whereby this new rule is applied to first level of metal (metal-1) routing.

In accordance with the objectives of the invention a new algorithm is provided for the routing of metal-1 layer of interconnect. The invention provides and algorithm that assures that a new (layout or design) rule, which is provided for metal interconnects for 0.13 µm or less technology, can be implemented.

This new layout rule requires that, at the metal-1 level of interconnect, for metal interconnect have a metal width that is larger than or equal to 0.3 µm and a parallel run length of the two adjacent lines that is larger or equal to 1 µm and the minimum space between two adjacent metal lines must be larger than 0.22 µm. The metal-1 layer is the only layer that uses both the standard library and the place-and-route tool, the implementation of the new layout rule assures that the standard library can continued to be used for technology of 0.13 µm or less.

The invention creates a grid of horizontal and vertical lines across a plane, the plane is the plane in which metal-1 is to be created. This plane overlies an (underlying) layer of metal, such as metal of a basic cell component, to which interconnects must be established by the metal-1 pattern. By using the coordinates of the intersects of the horizontal and the vertical lines, these intersects can be assigned attributes that indicate whether a particular intersect should or should not be connected to the underlying layer of metal. Using these attributes of the intersects of the imaginary metal grid, an intersect that can be interconnected with the underlying layer of metal can now be extended beyond that intersect, making a maximum pattern available for interconnect to a pin type in the underlying layer of metal. After the pattern of metal-1 has been created in this manner over the complete surface of the underlying layer of metal (of for instance a cell), the created metal-1 pattern can be analyzed for potential rule violations.

DESCRIPTION OF THE PREFERRED EMBODIMENTS

Figure 1:
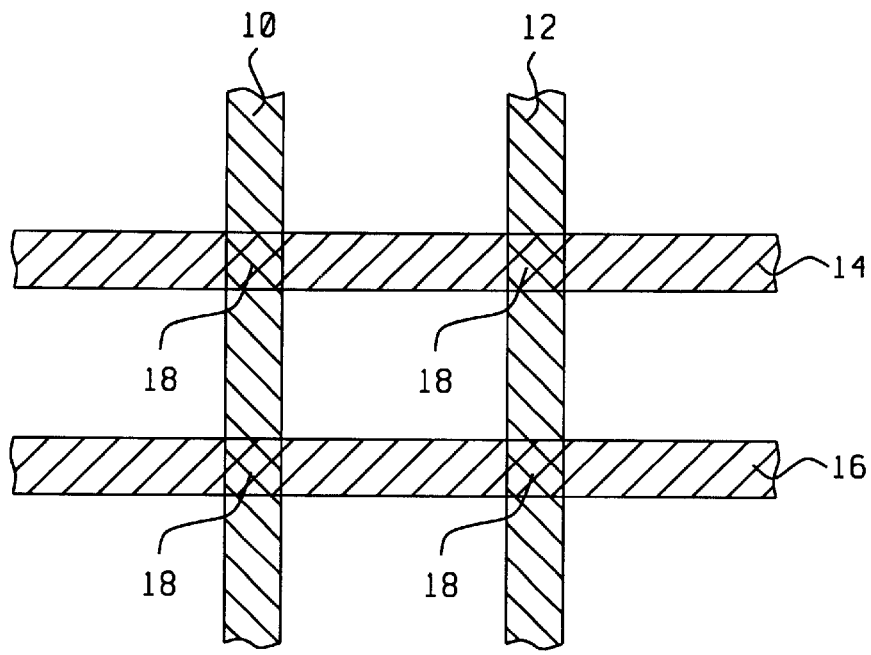
FIG. 1 shows a top view of a limited section of intersecting horizontal and vertical tracks used by the invention.

The invention addresses aspects of interconnect metal routing for 0.13 $\mu$m wiring technology. Many of the aspects of routing, such as most notably routing algorithms, have been discussed in the literature and will not be further addressed at this time. Special reference is made in this respect to U.S. Pat. No. 5,856,927 (Greidinger et al.) in which a detailed and comprehensive overview is provided of the various approaches of wire routing that are known in the art.

A number of points of interest that relate to the invention will first be identified in order to facilitate understanding the invention, as follows:

The invention addresses and enables metal-1 routing for 0.13 $\mu$m or less technology, that is for the creation of metal-1 interconnect wiring whereby the metal-1 wires have a cross section that is 0.13 $\mu$m or less The new algorithm of the invention makes possible the continued use of a standard library; this standard library is, prior to and in the absence of the new algorithm of the invention, used for technologies having for instance 0.50 $\mu$m or 0.35 $\mu$m or 0.25 $\mu$m or 0.18 $\mu$m wiring The invention provides a new algorithm for metal routing of the first level of metal (metal-1)

The invention is based on the observation that routing for the metal-1 layer is the only level of metal that uses both a standard library (data base) and a place-and-route tool (software support package); that is the top layer of metal that uses a standard library is metal-1, whereby the place-and-route tool progresses from metal-1 to higher levels of metal; therefore: implementing the new algorithm on the level of the metal-1 routing, the conventional standard library can continued to be used for chip layout and design The invention is based on analyzing attributes of points of intersection at the metal-1 level between a grid of horizontal tracks and vertical tracks overlying the metal-1; the place-and-route tool is track based, by therefore creating a grid of horizontal and vertical tracks within the confines of the layer of metal-1 that is being analyzed, intersects of these tracks can be evaluated, allowing for an evaluation of "worst-case" behavior of these points of intersect After the attributes of the indicated intersections have been determined and the pattern of metal-1 has been created using the algorithm of the invention, the Design Rule Check (DRC) function is invoked; the DRC function evaluates if a routing rule violation will occur at the next higher, that is the second or higher levels of metal The new rule that is supported by the invention specifies that, for metal-1 interconnects with a width of the interconnect metal of at least 0.30 $\mu$m and the parallel run length between adjacent lines of at least 0.10 $\mu$m, the spacing between adjacent interconnect lines must be at least 0.22 $\mu$m Although the issue of not meeting place and routing design rules arises at a relatively late stage in the layout and design of a semiconductor chip, the implementation of the new algorithm of the invention allows for an evaluation and possible correction of the standard library at an earlier time in the design cycle.

The principles on which the new algorithm of the invention are based are next explained using FIG. 1.

Intersections of horizontal and vertical tracks overlying metal-1 interconnects are evaluated to assure that these intersections form a "safe zone" for the connection of a pin (of an underlying layer of metal such as a layer of metal belonging to a cell or a gate array) to that intersection.

The invention adopts or uses a small box (S) for the purpose of determining the attributes of an intersection that potentially may become part of the metal-1 interconnects. The small box S is the surface of an area that is commonly held by a vertical and a horizontal track that is part of a grid of tracks that is extended over the surface area where metal-1 pattern is created.

The invention adopts or uses a big box (B) for the purpose of evaluating the actual or true attributes of an intersection of horizontal and vertical tracks formed over metal-1 interconnects.

After the actual attributes of the intersections have been determined, the place and route tool is invoked to determine the worst case conditions of the metal-1 interconnect; a metal-1 shape is temporarily added, the added metal-1 shape is based on and in accordance with the worst case conditions of the intersections.

From the worst-case scenario and the therefrom temporarily added metal-1 shape, the exact threshold values are selected to on-line execute the Design Rule Check function, this to assure that no rules have been violated by the worst-case design of the metal-1 interconnects.

To summarize:

a grid of intersecting horizontal and vertical tracks is extended over the surface area where metal-1 is created the commonly held surface are of the intersects of the horizontal and the vertical tracks defines a small box S the small box is used by the algorithm of the invention to determine the primary attributes of the intersect a big box B is created surrounding the small box in order to further explore the potential of using the small box surface area for the creation of an interconnect to an underlying layer of metal small boxes that remain candidates for the creation of interconnect thereto are further extended in metal surface, completing the creation of a pattern of metal-1 the completed pattern of metal-1 is analyzed for potential rule violations by a software package, the Design Rule Checker (DRC), and identified potential rules violations are further analyzed and modified for acceptance by the DRC.

Referring now specifically to FIG. 1, there are shown two sets of horizontal and vertical tracks superimposed over a level of metal-1, a first set of tracks 10 and 12 runs in a vertical direction, a second set of tracks 14 and 16 runs in a horizontal direction. The intersects 18 of these two sets of interconnects have been highlighted.

To differentiate between the vertical and the horizontal traces, the vertical traces may be referred to with even numbers while the horizontal traces may be referred to with odd numbers.

Further detail relating to the small box (S) and the big box (B) of the invention will now be provided. The small and big box of the invention both relate to and are, as previously highlighted, associated with intersections of a grid of horizontal and vertical tracks that are superimposed over a layer of metal-1 interconnects.

Figure 2:
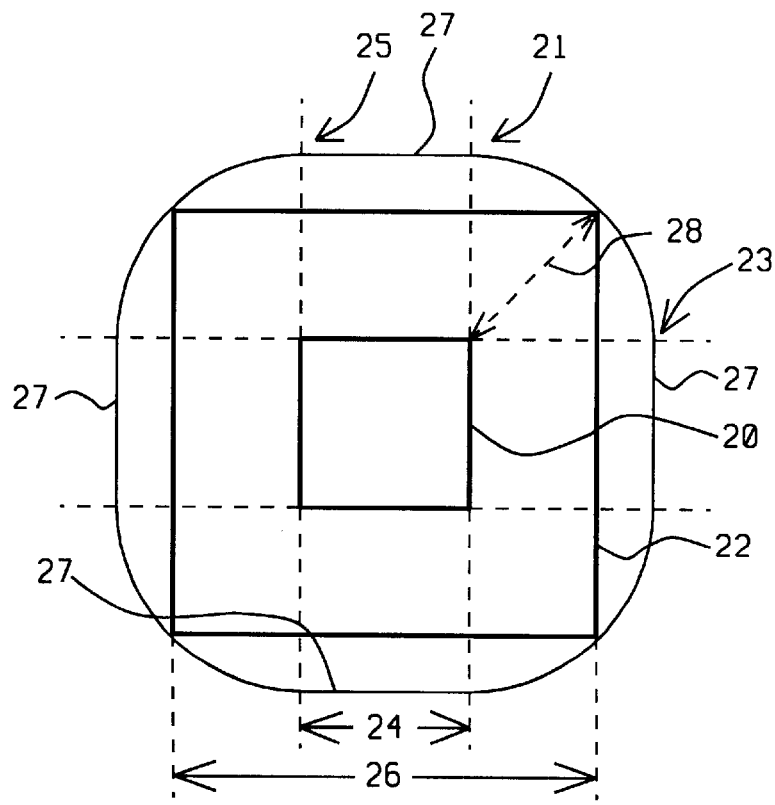
FIG. 2 highlights the small-box and the big-box concept of the invention.

Referring now specifically to FIG. 2, there are shown the following elements that are used by the new algorithm of the invention:

20, the small box (S), a square 22, the big box (B), a square, 24, the minimum width of the small box S, which is also the minimum length of a side of the small box S 26, the length of a side of the big box B, 27, a line of minimum spacing, which is the collection of all points that are at a distance from the sides of the small box 20; this distance equals the parameter 28 in curved sections of line 27, for instance the section of line 27 between points 21 and 23; line 27 forms over section 21 to 23 a quarter of a circle that has as center a closest corner of the small box 20; other sections of line 27, such as section 21–25 of line 27, are parallel with an adjacent side of the small box 20 and separated therefrom by a distance equal to the length of section 28; it must be noted that line 27 comprises four curved sections like section 21–23 and four linear section, like section 21–25; and 28, the minimum spacing that is provided around the small box 20.

The length 26 of the side of the big box 24 relates to the minimum spacing 28 and the minimum width 24, as follows:

The length of parameter 26 equals the length of the minimum width (24) plus (the length of the minimum spacing (28) multiplied by the square root of 2).

The small and the big box serve the following purposes:

1. According to the nature and extent of the overlap between the S-box and an underlying layer of metal-0, comprising for instance a cell, an explicit attribute of the intersection between the horizontal and the vertical interconnects can be determined, and
2. According to the nature and extent of the overlap between the B-box and the cell, the explicit attribute of the intersection between the horizontal and the vertical interconnects can be modified in order to create the final attribute of the intersection.

As attributes of the intersections have been identified the following items as highlighted using FIGS. 3a through 3g. Used throughout these figures are the references 20 for the small box S, 22 for the big box B, 30 for the metal-1 pattern and 32 for a pin on a cell (not further highlighted) over which the intersects of the horizontal and vertical tracks that are being evaluated are positioned. The horizontal and vertical tracks (superimposed over the metal-1) are not further highlighted in FIG. 3a through 3g, these tracks are only of significance in the following description as they relate to the small and the big box as previously identified.

The attributes (of the intersect between the horizontal and vertical tracks that are superimposed over metal-1) are determined by the place-and-route tool, which conventionally creates metal-1 routing. The attributes identify aspects of interfacing (of the intersects) between the layer of metal-1 and the underlying (layer of metal-0 of the) cell in addition to aspects of design of the layer of metal-1. These aspects or attributes are:

1. YES:
    indicating that there is no overlap between the small box S and metal-1 and metal-0, see FIG. 3a where the metal-1 pattern is highlighted with 30, the pin in the cell pattern is highlighted with 32 and the small box 20 and the big box 22 both do not overlap the pin 32; this YES attribute indicates that this location in the standard cell can be used for routing purposes, an interconnect can be provided to this location intersects that have the attribute of YES are candidates for further analysis since these intersects do not at this time indicate a rule violation 2. PIN NAME:
    the small box S overlaps a pin in a cell, the big box B does not overlap other metal-1; see FIG. 3b; or the small box does not overlap metal-1 and metal-0, the big box overlaps the pin; see FIG. 3c intersects that have the attribute of PIN NAME are candidates for further analysis since these intersects do not at this time indicate a rule violation 3. VSS/VDD:
    the small box overlaps a pin VSS/VDD pin in a cell, the big box does not overlap other metal-1; see FIG. 3b where the pin 32 is now a VSS/VDD pin; or the small box does not overlap metal-1 and metal-0, the big box overlaps the VSS/VDD pin; see FIG. 3c where the pin 32 is now a VSS/VDD pin;

intersects that have the attribute of VSS/VDD are no longer candidates for further analysis since VSS/VDD connects are not routed using the place and route function but are instead handled by abutting of cells 4. INT:
    the small box overlaps the metal-1 shape, see FIG. 3d; or the small box does not overlap metal-1 and metal-0, the big box overlaps the metal-1 shape; see FIG. 3e intersects that have the attribute of INT are no longer candidates for further analysis since these intersects indicate a potential rule violation 5. O:
    the small box overlaps a pin, the big box overlaps more that one metal-1 shape, that is metal-1 shapes, see FIG. 3f intersects that have the attribute of "O" are no longer candidates for further analysis since these intersects indicate a potential rule violation 6. NO:
    the small box does not overlap metal-1 or metal-0, the big box overlaps more than two metal-1 shapes, that is shape 30, 30' and 30", FIG. 3g
    intersects that have the attribute of NO are no longer candidates for further analysis since these intersects indicate a potential rule violation.

The above listed attributes can readily be derived by a software package by, for X and Y coordinates of an intersection, which is also referred to as a small box S and the therewith associated big box B, the presence or absence of a pin in a point of the underlying layer of metal of identical X and Y coordinates can be determined. The attribute of overlapping or not overlapping of a small or a big box with metal-1 can also readily be determined since all parameters of location of the small box, the big box and the therewith associated metal-1 pattern, are known.

Figure 4:
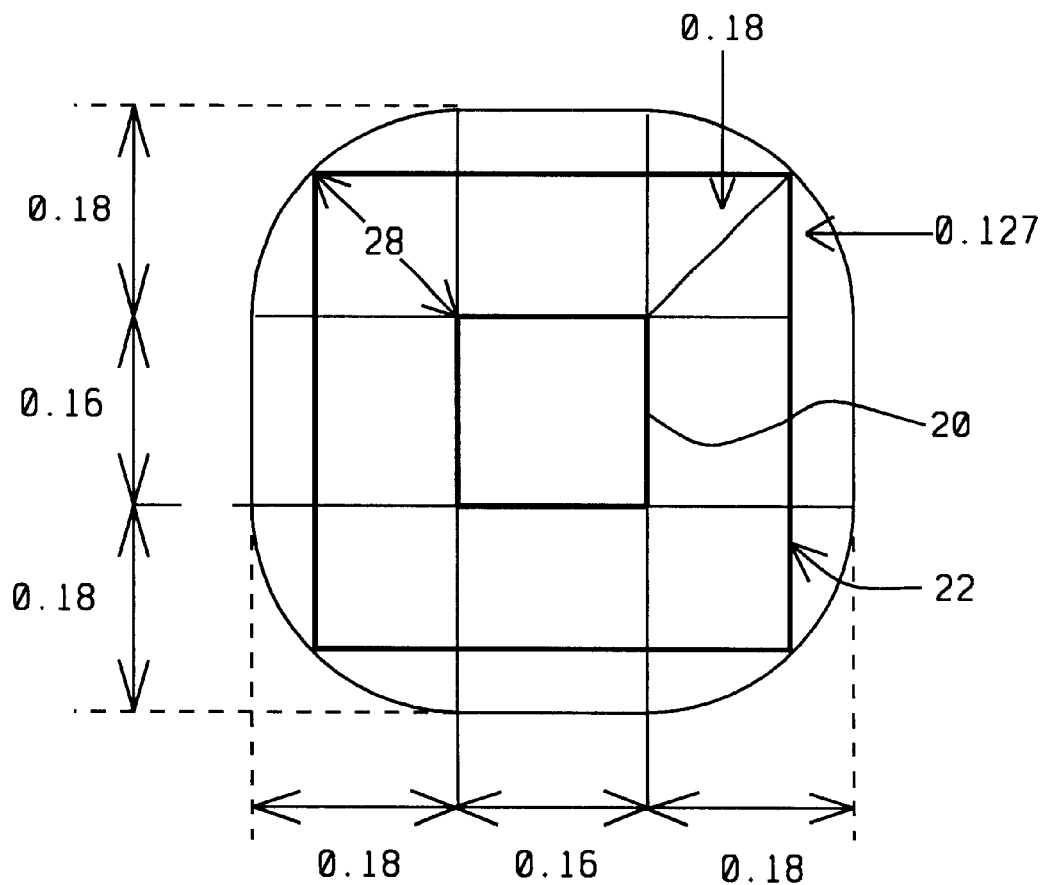
FIG. 4 shows a numeric example of the small-box and the big-box concept of the invention.

FIG. 4 is a presentation of a small box S (20) and a therewith configured big box B (22), actual parameters are provided (in µm) based on a value of parameter 24, FIG. 2, the minimum width of a side of the small box, that is equal to 0.16 µm. The value of parameter 28, the minimum spacing parameter, is selected by a software function that creates the above listed attributes of the small and the therewith associated big box.

The evaluation of the intersections of the tracks that are superimposed over the layer of metal-1 is performed in an order starting at the lower left intersection point and proceeding from there to the upper right intersection point. Only the intersection points that have as attributes "YES" and "PIN NAME" are candidates for a "size-up" function, that is the function that further connects metal-1 to the points of intersect having these attributes.

Figure 5:
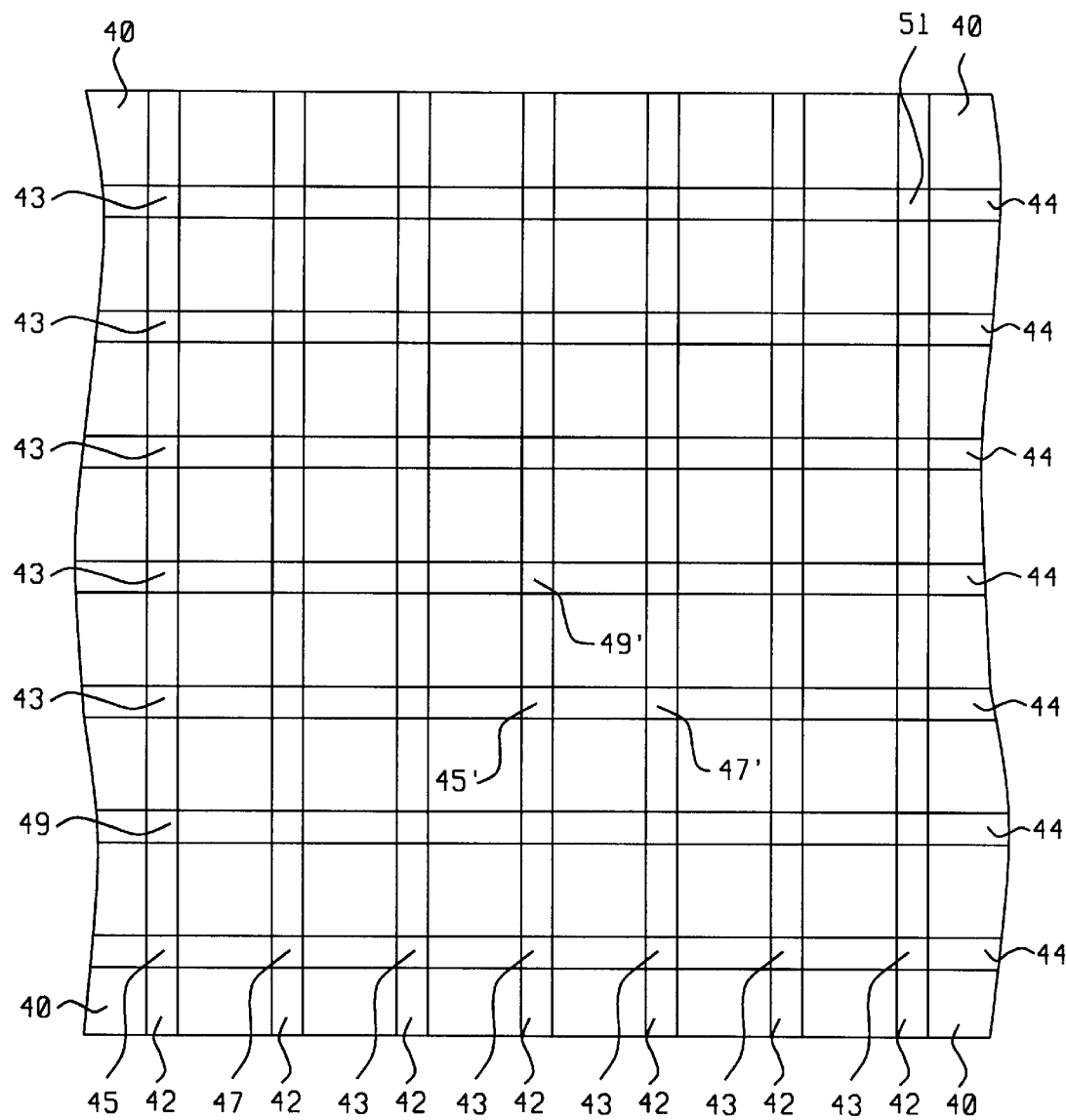
FIG. 5 shows a top view of a more extensive grid of intersecting horizontal and vertical tracks used by the invention.

Referring now to FIG. 5, there are highlighted the following features and aspects that are used by the new algorithm of the invention, specifically:
    40 shows a cell over which the metal-1 layer of interconnect is created; it must be noted that the cell extends beyond the boundaries of FIG. 5
    42, even numbered, vertical traces that are potential metal-1 traces; the word potential is used here in the sense that all or parts of traces 42 may become part of a metal-1 interconnect line, as will be further explained below
    44, odd numbered, horizontal traces that are potential metal-1 traces; the word potential is used here in the sense that all or parts of traces 44 may become part of a metal-1 interconnect line, as will be further explained below.

For each of the intersects 43, 45, 47 and 49 of the vertical and horizontal tracks the attribute of those intersect are determined. Only those intersects which have as attributes "YES" or "PIN NAME" can, as highlighted above, be used for further analysis of the interconnect between the metal of the underlying cell 40 and metal-1. Having established the above indicated attributes of the intersections, the invention is now ready to further create a metal pattern starting with an intersect and based on the attributes of other intersects.

The "size-up" program starts with an intersect that is located in the left-most lower corner of the grid of horizontal and vertical traces, that is intersect 45 in FIG. 5, and proceeds to the upper-most intersect located in the upper right hand corner of the horizontal and vertical traces, that is intersect 51 in FIG. 5. Starting with intersect 45, the program accesses the attributes of intersect 47, which is in a horizontal direction adjacent to intersect 45. Intersect 45 is, in the combination of intersects 45 and 47, referred to as the left point of the pair of intersects. Since only points of intersects that are candidates for further interconnect as part of metal-1 are accessed, the two intersects 45 and 47 must be further interconnected if these two intersects are overlying the same pin of the cell metal 40, that is if these two intersects have the attribute of "YES" and/or "PIN NAME". In that case therefore, metal will be extended between intersects 45 and 47 in a horizontal direction such that this metal abuts the left point 45.

Similar reasoning is valid with respect to points of intersect that extend in a vertical direction, such as points of intersect 45 and 49: if these two intersect have the "YES" and/or "PIN NAME" as an attribute, a rectangle of metal is created between these two intersects 45 and 49 that abuts the bottom point 45.

While points of intersect 45, 47 and 49 are located at a corner of the total grid of traces 42/44, it is clear that equal procedures apply to points of intersect that are located at any other location within the grid of tracks, such as points 45', 47' and 49', which have been located arbitrarily within the grid of tracks.

It is from the above clear that the algorithm of the invention provides for:
1. identifying points within tracks overlying metal-1 that can be considered for further interconnect to an underlying layer of metal, such as the layer of metal of a conventional cell that is used as a basic structure in the creation of a semiconductor device; that is identifying such points as YES points or PIN TYPE points, these latter two types of points are candidates for further consideration in forming a pattern of metal-1
2. the surface area of the candidates that have been identified as being points that can be connected to an underlying layer of metal can be further extended by interconnecting, in a horizontal or a vertical direction, YES points that can further be connected to the same PIN NAME of the underlying layer of metal, and
3. having completed the analyzes and the therewith associated extension of the metal-1 pattern, the created metal-1 pattern can now be analyzed for potential second order violations by a Design rule Checking (DRC) program; any metal-1 pattern that is identified as a potential pattern violation is then further analyzed and can be corrected.

The "size-up" function, which determines the above-indicated attributes of the intersections between horizontal and vertical traces superimposed over the layer of metal-1:
1) For a given PIN NAME, creates a small box in the metal-1 layer
2) adopts a big box to define the final attributes.

Boundary modification can be made based on the findings of the algorithm of the invention as follow:
    if the relationship between adjacent intersects is: "YES-PIN-PIN", the metal-1 rectangle can be extended to the "YES" point
    if the relationship between adjacent intersects is: PIN-PIN-YES", the metal-1 rectangle can be extended to the "YES" point.

It must further be pointed out that potential rule violations may lead to re-design of the metal-1 pattern whereby for instance, for the case where a "0" attribute has initially been identified (meaning: the S-box overlaps a pin, the B-box overlaps more than two shapes of metal-1) can be changed to a "PIN" attribute by changing the width of one or more interconnects of the metal-1 pattern such that the B-box no longer overlaps two shapes of metal-1. Also, a "NO" attribute (meaning that this is an empty point and that the B-box overlaps more than two metal-1 shapes) can be changed to a "YES" attribute again by modifying the width of one or more interconnects of the metal-1 pattern. From this can be concluded that the algorithm of the invention initially results in an over-constraint on the layout of metal-1, rather than an under-constraint. The over-constraint may at a later time be relieved but the algorithm of the invention provides an extra margin of safety in the layout of the metal-1 pattern.

The programming attributes of the invention will next be highlighted. For the programming of the invention, access must exist to data files that contain information of for instance two layers of metal. The lower of these two layers is representative of for instance a basic cell or gate array that is used to create and further interconnect a semiconductor device.

The upper of these two layers is the layer of metal-1, which is the first layer of metal that is used to affect the indicated creation and further interconnection of a semiconductor device. The lower layer of metal will be referred to as metal-0 and represents the characteristics of the (cell or gate array) layer of metal. Specifically indicated in this metal-0 file will be, for each point in a plane of the metal-0 layer: the presence or absence of metal and if that point contains a point of interconnect, also referred to as a pin. In view of the fact that both layers of metal-0 and metal-1 can be referred to by identical X and Y coordinates, it stands to reason that overlying points of these two layers can be compared and examined. From this examination it can be determined whether for two overlying points, having the same X and Y coordinates, these points do or do not have the attributes of YES and PIN NAME as these attributes have previously been explained.

The software support functions that are required in support of the algorithm of the invention can functionally be sub-divided into three functions:

a function to specify and calculate the surface area over the layer of metal-1 that needs to be analyzed; this function includes aspects of coordinates of the tracks that are used by the algorithm of the invention, the spacing between the tracks and the small box and the large box that are associated with the intersects of the tracks that are superimposed over the surface of the layer of metal-1 a function to analyze the intersects of the tracks overlying the layer of metal-1 and the assignment of attributes to these intersects, and the function of creating a layer of metal-1 based on the attributes of the intersects of the tracks overlying the layer of metal-1.

These latter three functions are next discussed in detail.

Figure 6:
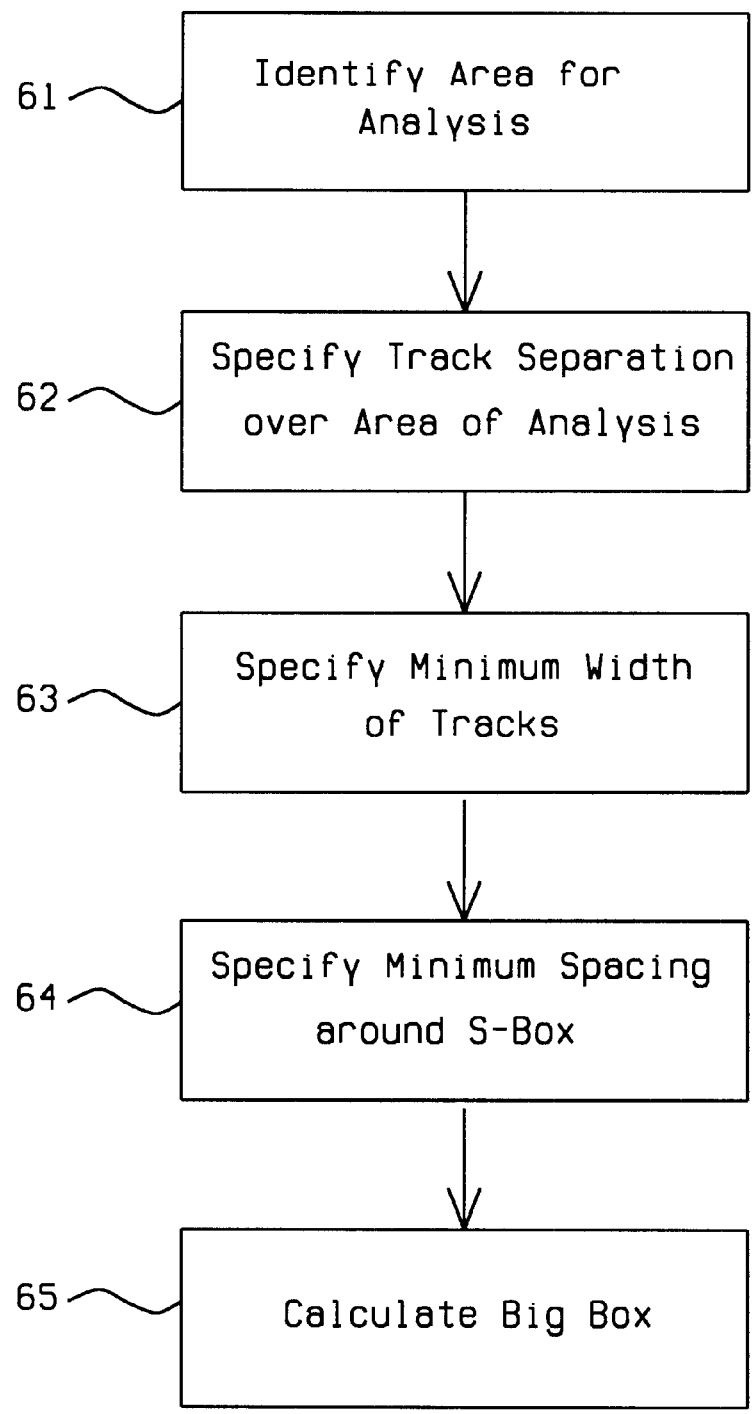
FIG. 6 shows a flow chart of a first function in support of the invention, that is to specify and calculate the surface area over the layer of metal-1 that needs to be analyzed.

Referring now specifically to the flowchart that is shown in FIG. 6 there are identified:

61, identifying the surface area in the layers of metal-0 and metal-1 that must be analyzed, using the algorithm of the invention; a typical method of identifying such a surface area is by using conventional Cartesian coordinates, with an X-axis and an Y-axis, whereby the X-axis perpendicularly intersects with the Y-axis; the surface area that is to be analyzed is bounded by the X-axis and the Y-axis and two lines that run parallel with these the X and the Y axis at a distance removed from these axis by $X_{max}$ (for the line that runs parallel with the Y-axis) and $Y_{max}$ (for the line that runs parallel with the X-axis; the surface area that is bounded by these four lines may be a square or may be a rectangle 62, the location of the tracks over the surface that is to be analyzed is next specified as a spacing between adjacent tracks; this spacing is defined as the distance between center lines of the tracks, whereby the center line is defined as the line that 1) runs parallel and between two sides of a small box of a track intersection and that 2) is equidistant to these two parallel sides of a small box of a track intersection; it stands to reason that the previously defined distances between the intersect of the X and Y-axis and $X_{max}$ and $Y_{max}$ will be divided into sections of equal lengths, whereby however this division does not have to result in the sections along the X-axis being equal in length to the sections along the Y-axis.

63, after the surface area of analysis has been identified, the tracks that are superimposed by the algorithm of the invention over the surface area that must be analyzed and their intersects must be further specified; a user input for this purpose is the minimum width of the tracks that are created over the surface of the metal-1 surface, this is parameter 24 of FIG. 2

64, the minimum spacing around the S-box must next be specified, that is parameter 24 in FIG. 2, this parameter may also be a user specified parameter 65, from the specifications of the minimum width of the tracks and the minimum spacing around the S-box, the dimensions of the big box can now be calculated, that is parameter 26 in FIG. 2; this calculation proceeds in accordance with the previously indicated relationship of:

"The length of parameter 26 equals the length of the minimum width (24) plus (the length of the minimum spacing (28) multiplied by the square root of 2)".

From the above specifications, a number of which have been identified as being provided by the user of the algorithm of the invention, it is clear that all the geometric parameters that relate to and that describe the tracks that are used by the algorithm of the invention are now known. The tracks are specified, thereby including the width of the tracks, the spacing of the tracks and the small box and big box of the intersects of the horizontal and vertical tracks. These specifications are equally valid for the surface of the layers of metal-0, comprising for instance the basic cell and the gate arrays from which a personalized semiconductor device is created, and the layer of metal-1, which is used to implement the personalization of the semiconductor device using the for instance referred to standard cell and gate array circuits as basic building components. The surface area in the layer of metal-1 that is specified for analysis overlies and is aligned with the surface are of the layer of metal-0.

It must be noted that the user of the algorithm of the invention, by means of the specifications that are provided by this user, can determine the "granularity" of the analysis, that is the density and the surface area of the intersections of the horizontal and the vertical tracks that are used by the algorithm of the invention.

Next will be discussed the function of assigning attributes to the intersections of the tracks created overlying the layer of metal-1.

All of the above specifications and the therefrom-derived parameters represent numerical values that relate to concepts, such as the small box and the big box, on which the algorithm of the invention is based. For each of the parameters, such as the tracks and the therewith associated small box and big box, one or more tables are created by the supporting software in which the identified parameters are stored in a logical manner and from which these data can be accessed and extracted for each of the items, such as tracks and intersects thereof, overlying the layer of metal-1. From the flowchart that is shown in FIG. 6, it is clear that the surface of the layer of metal-1, and by association therewith the surface of the layer of metal-0, is defined within the scope of the algorithm of the invention, thereby including all concepts and constructs that are required for functionality of the algorithm of the invention.

It must from the previous be emphasized that all parameters that apply to the tracks and the therewith associated values of the small box and the big box that are created for metal-1 equally apply to features as parameters of location and area surface for metal-0. From this can be concluded that for a point or surface are that is part of the layer of metal-1 a therewith associated and aligned point and surface area can be identified that belongs to the layer of metal-0. Aspect of interconnect of a point or surface area in the layer of metal-1 can therefore be determined as these aspects relate to and are dependent on aspect of design of an therewith associated and aligned point or surface area in the layer of metal-0. The aspects of layer-0 may in this respect impact the design of the pattern of metal-1, this impact is decided by the algorithm of the invention by means of the calculated attributes of the intersects of the tracks created over the surface of the layer of metal-1.

From the numerical values that have been created relating to the tracks and the therewith associated deign aspects of the algorithm of the invention, the software support functions can determine aspect or attributes of the intersects of the tracks that have been created overlying the layer of metal-1. These attributes are dependent on conditions of design of the underlying layer of metal-0, and more specifically on how aspects of design of the layer of metal-0 relate to aspects of design of the layer of metal-1.

Figure 7:
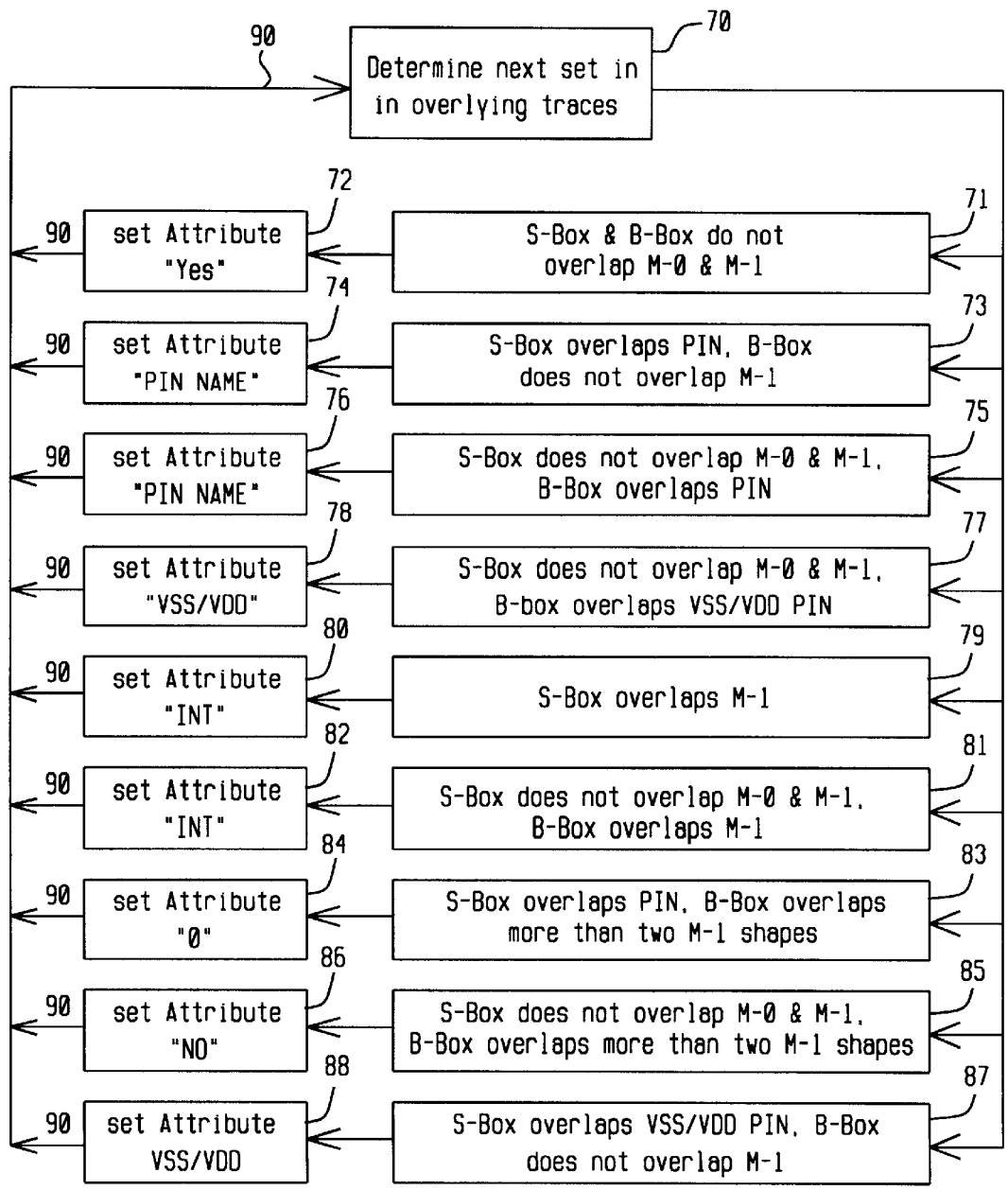
FIG. 7 shows a flow chart of a second function in support of the invention, that is a function to analyze the intersects of the tracks overlying the layer of metal-1 and the assignment of attributes to these intersects.

The second major software support function that has been identified above, that is the function of analyzing the intersects of the tracks overlying the layer of metal-1 and the assignment of attributes to these intersects, is next discussed using the flowchart of FIG. 7.

These design aspects as the relate to the layers of metal-0 and metal-1 are first highlighted:
1. Does the S-box overlap no metal-1 and no metal-0, further does the B-box overlap no metal-1 and no metal-0
2. Does the S-box overlap a pin in metal-0, further does the B-box not overlap another metal-1 shape
3. Does the S-box overlap no metal-1 and no metal-0, does the B-box only overlap this pin
4. Does the S-box overlap a VDD/VSS pin in metal-0, does the B-box not overlap another metal-1 shape
5. Does the S-box overlap no metal-1 and no metal-0, does the B-box only overlap a VDD/VSS pin
6. Does the S-box overlap a metal-1 shape
7. Does the S-box overlap no metal-1 and no metal-0, does the B-box overlap a metal-1 shape
8. Does the S-box overlap a pin in metal-0, does the B-box overlap more than two metal-1 shapes
9. Does the S-box overlap no metal-1 and no metal-0, does the B-box overlap more than two metal-1 shapes.

Figure 3A:
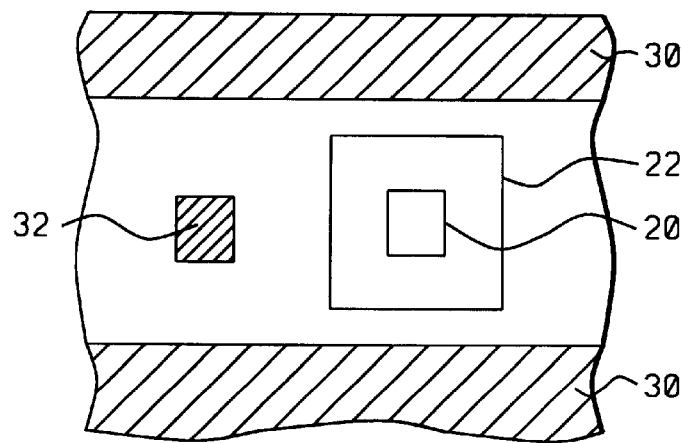
FIGS. 3a through 3g show the various configuration of metal-1, thereby including considerations of a layer of underlying metal.
Figure 3B:
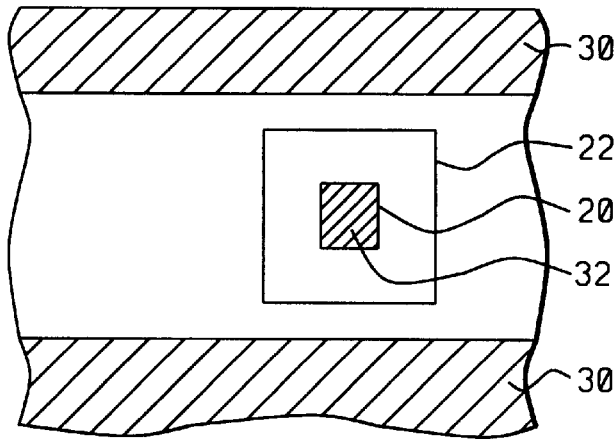
Figure 3C:
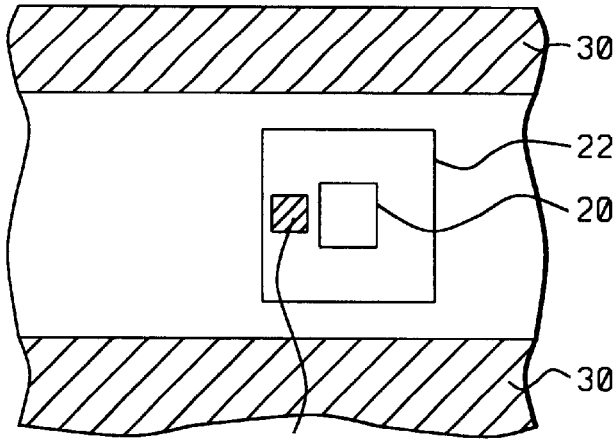
Figure 3D:
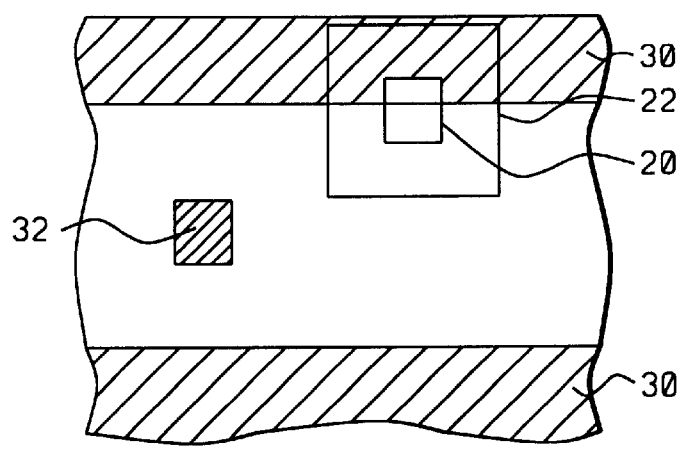
Figure 3E:
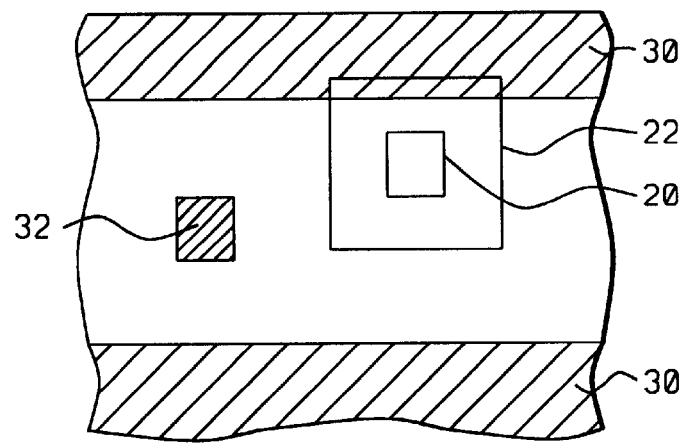
Figure 3F:
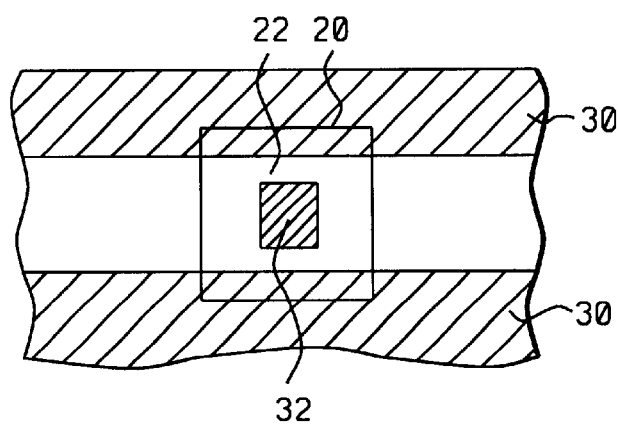
Figure 3G:
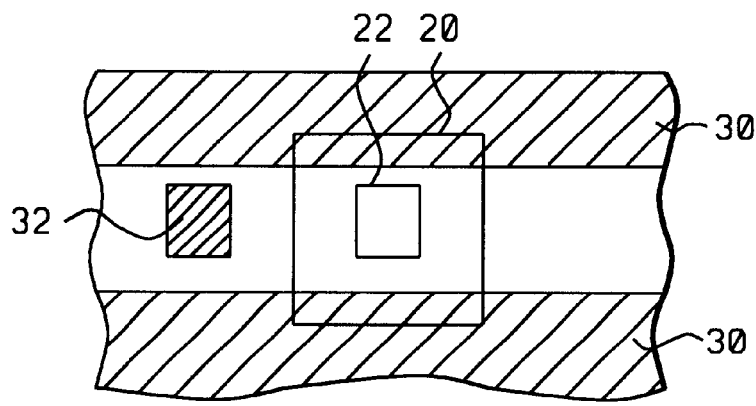

Based on the above determinations, the following attributes can be assigned to the intersects of the tracks overlaying the layer of metal-1, see FIG. 7:

71, the S-box overlaps no metal-1 and no metal-0, the B-box overlaps no metal-1 and no metal-0, assign the attribute "YES" to the track intersect, function 72, FIG. 7, refer also to FIG. 3a 73, the S-box overlaps a pin in metal-0, the B-box does not overlap another metal-1 shape, assign the attribute "PIN NAME" to the track intersect, function 74, FIG. 7, refer also to FIG. 3b 75, the S-box overlaps no metal-1 and no metal-0, the B-box only overlaps this pin, assign the attribute "PIN NAME" to the track intersect, function 76, FIG. 7, refer also to FIG. 3c 87, the S-box overlaps a VDD/VSS pin in metal-0, the B-box does not overlap another metal-1 shape, assign the attribute "VDD/VSS" to the track intersect, function 88, FIG. 7, refer also to FIG. 3b and comments provided therewith 77, the S-box overlaps no metal-1 and no metal-0, the B-box only overlaps a VDD/VSS pin, assign the attribute "VDD/VSS" to the track intersect, function 78, FIG. 7, refer also to FIG. 3c and comments provided therewith 79, the S-box overlaps a metal-1 shape, assign the attribute "INT" to the track intersect, function 80, FIG. 7, refer also to FIG. 3d 81, the S-box overlaps no metal-1 and no metal-0, the B-box overlaps a metal-1 shape, assign the attribute "INT" to the track intersect, function 82, FIG. 7, refer also to FIG. 3e 83, the S-box overlaps a pin in metal-0, the B-box overlaps more than two metal-1 shapes, assign the attribute "0" to the track intersect, function 84, FIG. 7, refer also to FIG. 3f 85, the S-box overlaps no metal-1 and no metal-0, the B-box overlaps more than two metal-1 shapes, assign the attribute "NO" to the track intersect, function NO, FIG. 7, refer also to FIG. 3g.

Further highlighted in the flowchart of FIG. 7 is the function 90 which returns the program, after an attribute has been determined and assigned, to the next set of tracks, that is function 70 in FIG. 7.

The traces are successively selected by starting with the traces which are closes located to the intersect of the X and Y-axis from which the traces are expanded in the direction of $X_{max}$ and $Y_{max}$. The method of placing the tracks has previously been highlighted and therefore will not be further discussed at this time.

The third major function of the support software functions that apply to the algorithm of the invention, that is the function of creating a layer of metal-1 based on the attributes of the intersects of the tracks overlying the layer of metal-1, is now described.

It is clear from the previous explanation that, at this stage of the analysis, there is available a matrix of intersects of tracks that have been created overlying a layer of metal-1, for each of these intersects an attribute has been determined. Using these attributes, the third software function analyzes the extension of metal-1 from the intersections of the tracks. The sequence in which the track intersections are analyzed can be described by the factor $a_{ij}$, which is a conventional n×m matrix variable with the value of "i" ranging from 1 through n, varying along the X-axis of the Cartesian coordinates. The value of "j" ranges from 1 through m, varying along the Y-axis of the Cartesian coordinates. The parameter "j" can be selected as the first variable and represents a row number, the variable "i" is the second variable and represents a column number. From this variable of $a_{ij}$ the concept of analyzing the intercepts starting at a lowest left hand corner and from there proceeding to an upper right hind corner can readily be interpreted. A first value of "1" is selected for the parameter "j", all intersects within this row are analyzed, that is the value of the parameter "i" is selected from a value of 1 through n. After this analysis has been completed, the value of "j" is sequentially increased, for each selected value of "j", the intersects of the n columns with that row "j" are analyzed. This process in repeated to the point where the highest or last row number "m" has been analyzed for all "n" intersects contained within that row.

The addition of metal to the track intersects is controlled by the following rule: wherever two adjacent intersects are encountered that have a desired attribute, that is the attribute of YES and PIN NAME, the metal-1 is extended between these two intersects. This extension can take place in both a horizontal or X direction and in a vertical or Y direction. This latter statement implies that the previous method of analyzing the intersects of the n×m matrix must further be extended to also include the analysis between adjacent intersects in a vertical or Y direction. This additional requirement is, from an implementation point of view, easiest addressed by first analyzing, in the matrix sequence of $a_{ij}$ and as highlighted above, adjacency of applicable or usable intersects in a X direction and completing this analysis for the n×m matrix of intersects. After this horizontally directed analysis has been completed for all rows of the matrix, the analysis is now repeated but analyzing all intersects for all columns of the matrix, further extension of metal-1 in an Y or vertical direction.

As a final rule that applies to the above evaluation of extending the metal-1 layer must be stated that each intersection of the n×m matrix may be selected no more than one time as a point of origin for the analysis in the X and in the Y direction. This rule assures that an intersect that has become a part of a string of interconnected intersects extended in a horizontal direction, can during the following vertical intersect analysis be selected as a point of origin for further extending the layer of metal-1 in a vertical direction.

Figure 8:
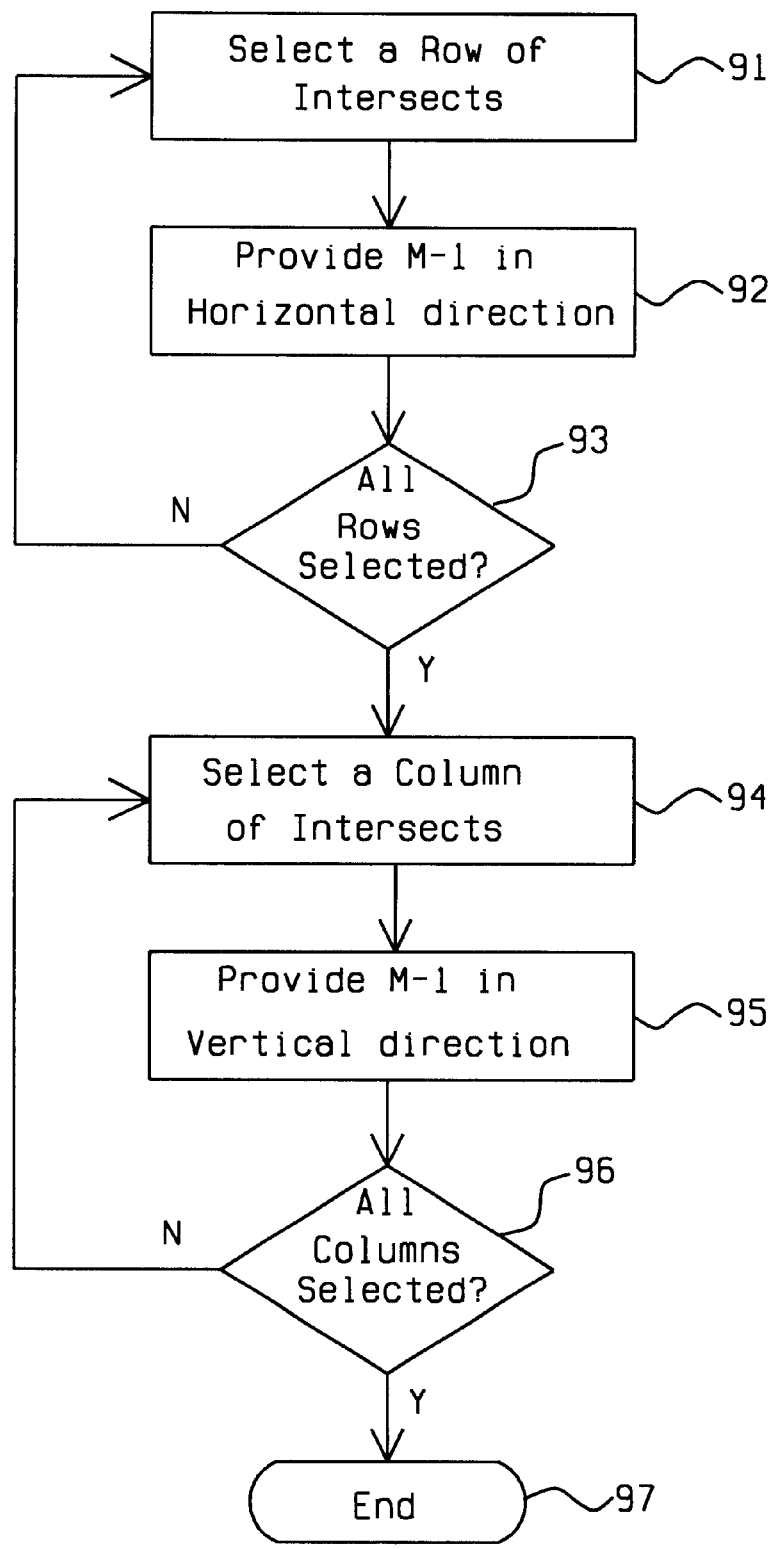
FIG. 8 shows a flow chart of a third function in support of the invention, that is a function of creating a layer of metal-1 based on the attributes of the intersects of the tracks overlying the layer of metal-1.

Keeping the above-presented text relating to the extension of metal-1 in mind, the flow diagram of FIG. 8 can next be discussed.

Function 91 of FIG. 8 selects a row for analysis of the intersects contained therein. This process of row selection has been previously discussed in detail.

After a row has been selected, the process of analyzing adjacent intersects having the desired attributes of "YES" and "PIN TYPE" is performed. Metal-1 is extended between adjacent intersects that have been assigning these desired attribute. The search and the therewith associated extension of metal-1 between adjacent intersects is interrupted and no more metal-1 is extended at the point where a invalid intersect, not having the desired attribute, is encountered. This invalid intersect is skipped and the search further resumes starting with the intersect in a horizontal direction that is adjacent to the encountered not valid intersect. From that point valid intersects are again interconnected with metal-1 in a horizontal direction. This process continues to the point where all intersects of the column have been exhausted, creating extensions of metal-1 in that row the further interconnect intersections having valid attributes.

If not all rows have been analyzed, function 93 of FIG. 8, the next row is selected and analyzed, Function 91 of FIG. 8, a process that is repeated to the point where all rows have been completed, completing providing metal-1 interconnects in a horizontal direction for all rows of the n×m matrix.

The steps that are performed for providing metal-1 in a vertical direction are then performed, as highlighted by functions 94, 95 and 96 of FIG. 8. These functions are functionally similar to the previously highlighted functions 91, 92 and 93 and therefore do not need to be further detailed. The functions 94, 95 and 96 provide metal-1 interconnects in a vertical direction for all columns of the n×m matrix.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A Computer Program Product for analysis of second order metal rule violations using a standard library, comprising:

a standard library comprising circuit elements as basic semiconductor design components, therewith determining placement of said circuit elements, said circuit elements comprising a conductive level of patterned metal-0;

means of globally routing all nets of a netlist, creating a level of metal-1 interconnects overlying said basic semiconductor design components, therewith overlying said level of patterned metal-0;

means of creating a grid of tracks overlying said metal-1, said grid of tracks comprising track interconnects;

means of determining attributes of said track interconnect, thereby including attributes of "YES" and "PIN"; and means of expanding said metal-1 interconnects based on said attributes.

2. The Computer Program Product of claim 1, said means of creating a grid of tracks overlying said metal-1 comprising:

means of designating a bounded surface area within said layer of metal-1 interconnect, said bounded surface area being bounded by Cartesian coordinates and a first linear boundary extending in parallel with an X-axis of said Cartesian coordinates at a distance of $Y_{max}$ from said X-axis, said bounded surface area being further being bounded by a second linear boundary extending in parallel with an Y-axis of said Cartesian coordinates at a distance of $X_{max}$ from said Y-axis;

means of creating a grid of tracks overlying bounded surface area within said layer of metal-1 interconnect, said tracks being parallel with said X and said Y-axis of said Cartesian coordinates, said tracks intersecting thereby creating a multiplicity of track intersections, said intersections comprising a small box S and a big box B, said small box S and said big box B comprising a square, sides of said small box S having a length of minimum width; and means of specifying said parameter of minimum width and a parameter of minimum spacing, said minimum width being the width of said tracks further being equal to a side of said small box S, said minimum spacing being a parameter determining a side of said big box B, sides of said big box B having a length related to said minimum width and said minimum spacing parameter by a spacing equation.

3. The Computer Program Product of claim 2, said small box S comprising a surface area of said track intersects.

4. The Computer Program Product of claim 2, said big box B being bounded by a surface area surrounding said small box S.

5. The Computer Program Product of claim 4, said surface area surrounding said small box S being bounded by a surface boundary, said surface boundary comprising a total of four first sections in parallel with sides of said small box S and being of equal length therewith, said surface boundary further comprising a total of four second sections sequentially spaced between and forming one continuous boundary with said four first sections after said four first sections have been sequentially spaced, said four second sections comprising a quarter circle having a center that coincides with sequential corners of said small box S and having a diameter equal to a minimum spacing.

6. The Computer Program Product of claim 5, said minimum width and said minimum spacing being related to a length of a side of said big box B in accordance with the spacing equation, said length of said big box B comprising a summation of a first and a second factor, said first factor being that the length of said minimum width, said second factor being the length of the said minimum spacing multiplied by a square root of two.

7. The Computer Program Product of claim 1, said means of determining attributes of said track interconnect comprising:
  means of determining does the S-box of said track intersect overlap no metal-1 and no metal-0 and does the B-box of said track intersect overlap no metal-1 and no metal-0;
  means of determining does the S-box of said track intersect overlap a pin in metal-0 and does the B-box of said track intersect not overlap another metal-1 shape;
  means of determining does the S-box of said track intersect overlap no metal-1 and no metal-0 and does the B-box of said track intersect only overlap this pin;
  means of determining does the S-box of said track intersect overlap a VDD/VSS pin in metal-0 and does the B-box of said track intersect not overlap another metal-1 shape;
  means of determining does the B-box of the track intersect only overlap a VDD/VSS pin;
  means of determining does the S-box of the track intersect overlap a metal-1 shape;
  means of determining does the S-box of the track intersect overlap no metal-1 and no metal-0 and does the B-box overlap a metal-1 shape;
  means of determining does the S-box of the track intersect overlap a pin in metal-0 and does the B-box of said intersect overlap more than two metal-1 shapes; and
  means of determining does the S-box of the track intersect overlap no metal-1 and no metal-0 and does the B-box of said intersect overlap more than two metal-1 shapes.

8. The Computer Program Product of claim 7, further comprising means of assigning an attribute "YES" to the track intersect where the S-box overlaps no metal-1 and no metal-0 and the B-box overlaps no metal-1 and no metal-0.

9. The Computer Program Product of claim 7, further comprising means of assigning an attribute "PIN NAME" to the track intersect where the S-box overlaps a pin in metal-0 and the B-box not overlap another metal-1 shape.

10. The Computer Program Product of claim 7, further comprising means of assigning an attribute "PIN NAME" to the track intersect where the S-box overlaps no metal-1 and no metal-0 and the B-box only overlaps this pin.

11. The Computer Program Product of claim 7, further comprising means of assigning an attribute "VDD/VSS" to the track intersect where the S-box overlaps a VDD/VSS pin in metal-0 and the B-box does not overlap another metal-1 shape.

12. The Computer Program Product of claim 7, further comprising means of assigning an attribute "VDD/VSS" to the track intersect where the S-box overlaps no metal-1 and no metal-0 and the B-box only overlaps a VDD/VSS pin.

13. The Computer Program Product of claim 7, further comprising means of assigning an attribute "INT" to the track intersect where the S-box overlaps a metal-1 shape.

14. The Computer Program Product of claim 7, further comprising means of assigning an attribute "INT" to the track intersect where the S-box overlaps no metal-1 and no metal-0 and the B-box overlaps a metal-1 shape.

15. The Computer Program Product of claim 7, further comprising means of assigning an attribute "0" to the track intersect where the S-box overlaps a pin in metal-0 and the B-box overlaps more than two metal-1 shapes.

16. The Computer Program Product of claim 7, further comprising means of assigning an attribute "NO" to the track intersect where the B-box overlaps more than two metal-1 shapes.

17. The Computer Program Product of claim 1, said means of expanding said metal-1 interconnects based on said attributes comprising:
  means of determining adjacent track interconnects having a "YES" or a "PIN NAME" attribute of all tracks provided in a horizontal or X direction, interconnecting adjacent points such identified with metal interconnects there-in-between in a X-direction; then
  means of determining adjacent point of adjacent track interconnects having a "YES" or a "PIN NAME" attribute of all tracks provided in a vertical or Y direction, interconnecting adjacent points such identified with metal interconnects there-in-between in a Y-direction.

18. The Computer Program Product of claim 1, further comprising means of submitting said expanded metal-1 interconnects to a process of verification by a Design Rules Checking software support function.

19. A Computer Program Product for analysis of second order metal rule using a standard library, comprising:
  a standard library comprising circuit elements as basic semiconductor design components, therewith determining placement of said circuit elements, said circuit elements comprising a conductive level of patterned metal-0;
  means of globally routing all nets of a netlist, creating a level of metal-1 interconnects overlying said basic semiconductor design components, therewith overlying said level of patterned metal-0;
  means of creating a grid of tracks overlying said metal-1, said tracks comprising tracks in a horizontal or X direction, said tracks in addition comprising tracks in a vertical or Y direction perpendicularly intersecting with said tracks in a horizontal direction, said X and said Y directions being represented by perpendicularly intersecting Cartesian coordinates, said tracks creating track intersects, said track intersects comprising a small box S and a big box B;
  means of determining attributes of said track interconnect, comprising identifying track intersects having attributes of:
    (i) "YES", said "YES" track intersect attribute being assigned to a track intersect where the S-box of the track intersect overlaps no metal-1 and no metal-0, the B-box of the track intersect overlaps no metal-1 and no metal-0; and
    (ii) "PIN NAME", said "PIN NAME" track intersect attribute being assigned to:
      (1) a track intersect where the S-box of the track intersect overlaps a pin in metal-0, the B-box of the track intersect does not overlap another metal-1 shape; and (2) a track intersect where the S-box of the track intersect overlaps no metal-1 and no metal-0, the B-box of the track intersect overlaps this pin; and means of expanding said metal-1 interconnects based on said attributes.

20. The Computer Program Product of claim 19, said means of creating a grid of tracks overlying said metal-1 comprising:

means of designating a bounded surface area within said layer of metal-1 interconnect, said surface area being bounded by Cartesian coordinates and a first linear boundary extending in parallel with an X-axis of said Cartesian coordinates at a distance of $Y_{max}$ from said X-axis, further bounded by a second linear boundary extending in parallel with an Y-axis of said Cartesian coordinates at a distance of $X_{max}$ from said Y-axis;

means of creating a grid of tracks overlying said bounded surface area of said metal-1 interconnects, said tracks being parallel with said X and said Y-axis of said Cartesian coordinates, said tracks intersecting creating a multiplicity of track intersects, said intersects comprising a small box S and a big box B, said small box S and said big box B comprising a square, sides of said small box S having a length of minimum width; and means of specifying said parameter of minimum width and a parameter of minimum spacing, said minimum width being the width of said tracks further being equal to a side of said small box S, said minimum spacing being a parameter determining a side of said big box B, sides of said big box B having a length related to said minimum width and said minimum spacing parameter by a spacing equation.

21. The Computer Program Product of claim 19, said small box S comprising a surface area of said track intersect.

22. The Computer Program Product of claim 19, said big box B being bounded by a surface area surrounding said small box S.

23. The Computer Program Product of claim 22, said surface area surrounding said small box S being bounded by a surface boundary, said surface boundary comprising a total of four first sections in parallel to sides of said small box S and being of equal length therewith, said surface boundary further comprising a total of four second sections sequentially spaced between and forming one continuous boundary with said four first sections after said four first sections have been sequentially spaced, said four second sections comprising a quarter circle having a center that coincides with sequential corners of said small box S and having a diameter equal to a minimum spacing.

24. The Computer Program Product of claim 23, said minimum width and said minimum spacing being related to a length of a side of said big box B in accordance with the spacing equation, said length of said big box B comprising a summation of a first and a second factor, said first factor being that the length of said minimum width, said second factor being the length of the said minimum spacing multiplied by a square root of two.

25. The Computer Program Product of claim 19, said means of determining attributes of said track intersects further comprising:

means of determining does the S-box of said intersect overlap no metal-1 and no metal-0 and does the B-box of said intersect overlap no metal-1 and no metal-0;

means of determining does the S-box of said intersect overlap a pin in metal-0 and does the B-box of said intersect not overlap another metal-1 shape;

means of determining does the S-box of said intersect overlap no metal-1 and no metal-0 and does the B-box of said intersect only overlap this pin;

means of determining does the S-box of said intersect overlap a VDD/VSS pin in metal-0 and does the B-box of said intersect not overlap another metal-1 shape;

means of determining does the B-box of this intersect only overlap a VDD/VSS pin;

means of determining does the S-box of said intersect overlap a metal-1 shape;

means of determining does the S-box of said intersect overlap no metal-1 and no metal-0 and does the B-box overlap a metal-1 shape;

means of determining does the S-box of said intersect overlap a pin in metal-0 and does he B-box of said intersect overlap more than two metal-1 shapes; and means of determining does the S-box of said intersect overlap no metal-1 and no metal-0 and does the B-box of said intersect overlap more than two metal-1 shapes.

26. The Computer Program Product of claim 25, further comprising means of assigning an attribute "VDD/VSS" to the track intersect where the S-box overlaps a VDD/VSS pin in metal-0, the B-box does not overlap another metal-1 shape.

27. The Computer Program Product of claim 25, further comprising means of assigning an attribute "VDD/VSS" to the track intersect where the S-box overlaps no metal-1 and no metal-0, the B-box only overlaps a VDD/VSS pin.

28. The Computer Program Product of claim 25, further comprising means of assigning an attribute "INT" to the track intersect where the S-box overlaps a metal-1 shape, assign the attribute "INT" to the track intersect.

29. The Computer Program Product of claim 25, further comprising means of assigning an attribute "INT" to the track intersect where the S-box overlaps no metal-1 and no metal-0, the B-box overlaps a metal-1 shape.

30. The Computer Program Product of claim 25, further comprising means of assigning an attribute "0" to the track intersect where the S-box overlaps a pin in metal-0, the B-box overlaps more than two metal-1 shapes.

31. The Computer Program Product of claim 25, further comprising means of assigning an attribute "NO" to the track intersect where the B-box overlaps more than two metal-1 shapes.

32. The Computer Program Product of claim 19, said means of expanding said metal-1 interconnects based o n said attributes comprising:

means of interconnecting adjacent points having a "YES" or a "PIN NAME" attribute of all tracks provided in a horizontal or X direction; then means of interconnecting adjacent points having a "YES" or a "PIN NAME" at tribute of all tracks provided in a vertical or Y direction.

33. The Computer Program Product of claim 19, further comprising means of submitting said expanded metal-1 interconnects to a process of verification by a Design Rules Checking software support function.

34. A method for analysis of second order metal rule violations using a standard library, comprising the steps of:

providing a standard library comprising circuit elements as basic semiconductor design components, therewith determining placement of said circuit elements, said circuit elements comprising a conductive level of patterned metal-0;

globally routing ail nets of a netlist, creating a level of metal-1 interconnects overlying said basic semiconductor design components, therewith overlying said level of patterned metal-1;

creating a grid of tracks overlying said metal-1, said grid of tracks comprising track interconnects;

determining attributes of said track interconnect, thereby including attributes of "YES" and "PIN"; and expanding said metal-1 interconnects based on said attributes.

35. The method of claim 34, said means of creating a grid of tracks overlying said metal-1 comprising the steps of:

designating a bounded surface area within said layer of metal-1 interconnect, said bounded surface area being bounded by Cartesian coordinates and a first linear boundary extending in parallel with an X-axis of said Cartesian coordinates at a distance of $Y_{max}$ from said X-axis, said bounded surface area being further being bounded by a second linear boundary extending in parallel with an Y-axis of said Cartesian coordinates at a distance of $X_{max}$ from said Y-axis;

creating a grid of tracks overlying bounded surface area within said layer of metal-1 interconnect, said tracks being parallel with said X and said Y-axis of said Cartesian coordinates, said tracks intersecting thereby creating a multiplicity of track intersections, said intersections comprising a small box S and a big box B, said small box S and said big box B comprising a square, sides of said small box S having a length of minimum width; and specifying said parameter of minimum width and a parameter of minimum spacing, said minimum width being the width of said tracks further being equal to a side of said small box S, said minimum spacing being a parameter determining a side of said big box B, sides of said big box B having a length related to said minimum width and said minimum spacing parameter by a spacing equation.

36. The method of claim 35, said small box S comprising a surface area of said track intersects.

37. The method of claim 35, said big box B being bounded by a surface area surrounding said small box S.

38. The method of claim 37, said surface area surrounding said small box S being bounded by a surface boundary, said surface boundary comprising a total of four first sections in parallel with sides of said small box S and being of equal length therewith, said surface boundary further comprising a total of four second sections sequentially spaced between and forming one continuous boundary with said four first sections after said four first sections have been sequentially spaced, said four second sections comprising a quarter circle having a center that coincides with sequential corners of said small box S and having a diameter equal to a minimum spacing.

39. The method of claim 38, said minimum width and said minimum spacing being related to a length of a side of said big box B in accordance with the spacing equation, said length of said big box B comprising a summation of a first and a second factor, said first factor being that the length of said minimum width, said second factor being the length of the said minimum spacing multiplied by a square root of two.

40. The method of claim 34, said determining attributes of said track interconnect comprising the steps of:

determining does the S-box of said track intersect overlap no metal-1 and no metal-0 and does the B-box of said track intersect overlap no metal-1 and no metal-0;

determining does the S-box of said track intersect overlap a pin in metal-0 and does the B-box of said track intersect not overlap another metal-1 shape;

determining does the S-box of said track intersect overlap no metal-1 and no metal-0 and does the B-box of said track intersect only overlap this pin;

determining does the S-box of said track intersect overlap a VDD/VSS pin in metal-0 and does the B-box of said track intersect not overlap another metal-1 shape;

determining does the B-box of the track intersect only overlap a VDD/VSS pin;

determining does the S-box of the track intersect overlap a metal-1 shape;

determining does the S-box of the track intersect overlap no metal-1 and no metal-0 and does the B-box overlap a metal-1 shape;

determining does the S-box of the track intersect overlap a pin in metal-0 and does the B-box of said intersect overlap more than two metal-1 shapes; and determining does the S-box of the track intersect overlap no metal-1 and no metal-0 and does the B-box of said intersect overlap more than two metal-1 shapes.

41. The method of claim 40, further assigning an attribute "YES" to the track intersect where the S-box overlaps no metal-1 and no metal-0 and the B-box overlaps no metal-1 and no metal-0.

42. The method of claim 40, further assigning an attribute "PIN NAME" to the track intersect where the S-box overlaps a pin in metal-0 and the B-box not overlap another metal-1 shape.

43. The method of claim 40, further assigning an attribute "PIN NAME" to the track intersect where the S-box overlaps no metal-1 and no metal-0 and the B-box only overlaps this pin.

44. The method of claim 40, further assigning an attribute "VDD/VSS" to the track intersect where the S-box overlaps a VDD/VSS pin in metal-0 and the B-box does not overlap another metal-1 shape.

45. The method of claim 40, further assigning an attribute "VDD/VSS" to the track intersect where the S-box overlaps no metal-1 and no metal-0 and the B-box only overlaps a VDD/VSS pin.

46. The method of claim 40, further assigning an attribute "INT" to the track intersect where the S-box overlaps a metal-1 shape.

47. The method of claim 40, further assigning an attribute "INT" to the track intersect where the S-box overlaps no metal-1 and no metal-0 and the B-box overlaps a metal-1 shape.

48. The method of claim 40, further assigning an attribute "0" to the track intersect where the S-box overlaps a pin in metal-0 and the B-box overlaps more than two metal-1 shapes.

49. The method of claim 40, further assigning an attribute "NO" to the track intersect where the B-box overlaps more than two metal-1 shapes.

50. The method of claim 34, said expanding said metal-1 interconnects based on said attributes comprising the steps of:

determining adjacent track interconnects having a "YES" or a "PIN NAME" attribute of all tracks provided in a horizontal or X direction, interconnecting adjacent points such identified with metal interconnects there-in-between in a X-direction; then determining adjacent point of adjacent track interconnects having a "YES" or a "PIN NAME" attribute of all tracks provided in a vertical or Y direction, interconnecting adjacent points such identified with metal interconnects there-in-between in a Y-direction.

51. The method of claim 34, further comprising submitting said expanded metal-1 interconnects to a process of verification by a Design Rules Checking software support function.

52. An method for analysis of second order metal rule using a standard library, comprising the steps of:
   providing a standard library comprising circuit elements as basic semiconductor design components, therewith determining placement of said circuit elements, said circuit elements comprising a conductive level of patterned metal-0;
   globally routing all nets of a netlist, creating a level of metal-1 interconnects overlying said basic semiconductor design components, therewith overlying said level of patterned metal-0;
   creating a grid of tracks overlying said metal-1, said tracks comprising tracks in a horizontal or X direction, said tracks in addition comprising tracks in a vertical or Y direction perpendicularly intersecting with said tracks in a horizontal direction, said X and said Y directions being represented by perpendicularly intersecting Cartesian coordinates, said tracks creating track intersects, said track intersects comprising a small box S and a big box B;
   determining attributes of said track interconnect, comprising identifying track intersects having attributes of:
      (i) "YES", said "YES" track intersect attribute being assigned to a track intersect where the S-box of the track intersect overlaps no metal-1 and no metal-0, the B-box of the track intersect overlaps no metal-1 and no metal-0; and
      (ii) "PIN NAME", said "PIN NAME" track intersect attribute being assigned to:
         (1) a track intersect where the S-box of the track intersect overlaps a pin in metal-0, the B-box of the track intersect does not overlap another metal-1 shape; and
         (2) a track intersect where the S-box of the track intersect overlaps no metal-1 and no metal-0, the B-box of the track intersect overlaps this pin; and
   expanding said metal-1 interconnects based on said attributes.

53. The method of claim 52, said creating a grid of tracks overlying said metal-1 comprising the steps of:
   designating a bounded surface area within said layer of metal-1 interconnect, said surface area being bounded by Cartesian coordinates and a first linear boundary extending in parallel with an X-axis of said Cartesian coordinates at a distance of $Y_{max}$ from said X-axis, further bounded by a second linear boundary extending in parallel with an Y-axis of said Cartesian coordinates at a distance of $X_{max}$ from said Y-axis;
   creating a grid of tracks overlying said bounded surface area of said metal-1 interconnects, said tracks being parallel with said X and said Y-axis of said Cartesian coordinates, said tracks intersecting creating a multiplicity of track intersects, said intersects comprising a small box S and a big box B, said small box S and said big box B comprising a square, sides of said small box S having a length of minimum width; and
   specifying said parameter of minimum width and a parameter of minimum spacing, said minimum width being the width of said tracks further being equal to a side of said small box S, said minimum spacing being a parameter determining a side of said big box B, sides of said big box B having a length related to said minimum width and said minimum spacing parameter by a spacing equation.

54. The method of claim 52, said small box S comprising a surface area of said track intersect.

55. The method of claim 52, said big box B being bounded by a surface area surrounding said small box S.

56. The method of claim 55, said surface area surrounding said small box S being bounded by a surface boundary, said surface boundary comprising a total of four first sections in parallel to sides of said small box S and being of equal length therewith, said surface boundary further comprising a total of four second sections sequentially spaced between and forming one continuous boundary with said four first sections after said four first sections have been sequentially spaced, said four second sections comprising a quarter circle having a center that coincides with sequential corners of said small box S and having a diameter equal to a minimum spacing.

57. The method of claim 56, said minimum width and said minimum spacing being related to a length of a side of said big box B in accordance with the spacing equation, said length of said big box B comprising a summation of a first and a second factor, said first factor being that the length of said minimum width, said second factor being the length of the said minimum spacing multiplied by a square root of two.

58. The method of claim 52, said determining attributes of said track intersects comprising the steps of:
   determining does the S-box of said intersect overlap no metal-1 and no metal-0 and does the B-box of said intersect overlap no metal-1 and no metal-0;
   determining does the S-box of said intersect overlap a pin in metal-0 and does the B-box of said intersect not overlap another metal-1 shape;
   determining does the S-box of said intersect overlap no metal-1 and no metal-0 and does the B-box of said intersect only overlap this pin;
   determining does the S-box of said intersect overlap a VDD/VSS pin in metal-0 and does the B-box of said intersect not overlap another metal-1 shape;
   determining does the B-box of this intersect only overlap a VDD/VSS pin;
   determining does the S-box of said intersect overlap a metal-1 shape;
   determining does the S-box of said intersect overlap no metal-1 and no metal-0 and does the B-box overlap a metal-1 shape;
   determining does the S-box of said intersect overlap a pin in metal-0 and does he B-box of said intersect overlap more than two metal-1 shapes; and
   determining does the S-box of said intersect overlap no metal-1 and no metal-0 and does the B-box of said intersect overlap more than two metal-1 shapes.

59. The method of claim 58, further comprising assigning an attribute "VDD/VSS" to the track intersect where the S-box overlaps a VDD/VSS pin in metal-0, the B-box does not overlap another metal-1 shape.

60. The method of claim 58, further comprising assigning an attribute "VDD/VSS" to the track intersect where the S-box overlaps no metal-1 and no metal-0, the B-box only overlaps a VDD/VSS pin.

61. The method of claim 58, further comprising assigning an attribute "INT" to the track intersect where the S-box overlaps a metal-1 shape, assign the attribute "INT" to the track intersect.

62. The method of claim 58, further comprising assigning an attribute "INT" to the track intersect where the S-box overlaps no metal-1 and no metal-0, the B-box overlaps a metal-1 shape.

63. The method of claim 58, further comprising assigning an attribute "0" to the track intersect where the S-box overlaps a pin in metal-0, the B-box overlaps more than two metal-1 shapes.

64. The method of claim 58, further comprising assigning an attribute "NO" to the track intersect where the B-box overlaps more than two metal-1 shapes.

65. The method of claim 52, said expanding said metal-1 interconnects based on said attributes comprising the steps of:

interconnecting adjacent points having a "YES" or a "PIN NAME" attribute of all tracks provided in a horizontal or X direction; then interconnecting adjacent points having a "YES" or a "PIN NAME" attribute of all tracks provided in a vertical or Y direction.

66. The method of claim 52, further comprising submitting said expanded metal-1 interconnects to a process of verification by a Design Rules Checking software support function.

* * * * *